United States Patent
Gupta et al.

(10) Patent No.: US 7,816,940 B1
(45) Date of Patent: Oct. 19, 2010

(54) ULTRA FAST DIFFERENTIAL TRANSIMPEDANCE DIGITAL AMPLIFIER FOR SUPERCONDUCTING CIRCUITS

(75) Inventors: Deepnarayan Gupta, Hawthorne, NY (US); Amol Inamdar, Elmsford, NY (US)

(73) Assignee: Hypres, Inc., Elmsford, NY (US)

( * ) Notice: Subject to any disclaimer, the term of this patent is extended or adjusted under 35 U.S.C. 154(b) by 0 days.

(21) Appl. No.: 12/535,434

(22) Filed: Aug. 4, 2009

Related U.S. Application Data (63) Continuation of application No. 11/824,419, filed on Jun. 29, 2007, now Pat. No. 7,570,075.

(51) Int. Cl.
*H03K 19/195* (2006.01)

(52) U.S. Cl. .............................. 326/4; 326/6

(58) Field of Classification Search ................. 326/1–7, 326/46
See application file for complete search history.

(56) References Cited

U.S. PATENT DOCUMENTS

| 5,233,243 A * | 8/1993 | Murphy et al. ................. 326/4 |
| 2010/0033252 A1 * | 2/2010 | Herr et al. .................... 330/286 |

* cited by examiner

*Primary Examiner*—Don P. Le
(74) *Attorney, Agent, or Firm*—Ostrolenk Faber LLP; Steven M. Hoffberg (57) ABSTRACT

Supercooled electronics often use Rapid Single Flux Quantum (RSFQ) digital circuits. The output voltages from RSFQ devices are too low to be directly interfaced with semiconductor electronics, even if the semiconductor electronics are cooled. Techniques for directly interfacing RSFQ digital circuits with semiconductor electronics are disclosed using a novel inverting transimpedance digital amplifier in conjunction with a non-inverting transimpedance digital amplifier to create a differential transimpedance digital amplifier that permits direct interfacing between RSFQ and semiconductor electronics.

21 Claims, 12 Drawing Sheets

ULTRA FAST DIFFERENTIAL TRANSIMPEDANCE DIGITAL AMPLIFIER FOR SUPERCONDUCTING CIRCUITS

RELATED APPLICATION

The present application is a continuation of U.S. patent application Ser. No. 11/824,419, filed Jun. 29, 2007, now U.S. Pat. No. 7,570,075, issued Aug. 4, 2009, the entirety of which is expressly incorporated herein by reference.

BACKGROUND OF THE INVENTION

1. Field of the Invention

The Invention is directed to the field of superconducting circuits, and, more particularly, to the field of single flux quantum (SFQ) to DC drivers for interfacing Rapid Superconducting Single Flux Quantum (RSFQ) circuits to semiconductor circuits.

2. Description of the Prior Art

Ultrafast superconducting digital circuits are based on Josephson junctions integrated together according to RSFQ Logic (Rapid-single-flux-quantum), first proposed by K. Likharev and V. Semenov (1991). This is also a low-voltage technology, with fast voltage pulses 4 picoseconds wide and 0.5 mV in amplitude. In order to transmit the digital information to conventional semiconductor circuits, several stages of amplification are needed. The non-inverting transimpedance digital amplifier popularly known as SFQ-to-DC converter (FIG. 1) is well established in the prior art (ref: RSFQ Logic/Memory Family: A New Josephson-Junction Technology for Sub-Terahertz-Clock-Frequency Digital Systems by K. Likharev and V. Semenov (1991)) as a low-speed output device for high-speed RSFQ digital test circuits. This low-speed limit is not because the non-inverting transimpedance digital amplifier is slow (actually, it is known to be very fast), but rather because its output voltage for earlier fabrication technology was limited to about 0.2 mV. For a high-speed output device that can interface with conventional broadband semiconductor amplifiers, amplitude of at least 1 mV is necessary. Conventionally, it was impossible to bridge this gap, so an alternative output technology was needed. One such technology based on series arrays of SQUID amplifiers was recently developed by A. Inamdar and S. Rylov (Pending U.S. patent application Ser. No. 11/705,351, filed Feb. 12, 2007, entitled Superconducting Switching Amplifier), with mV output at GHz rates.

Figure 3:
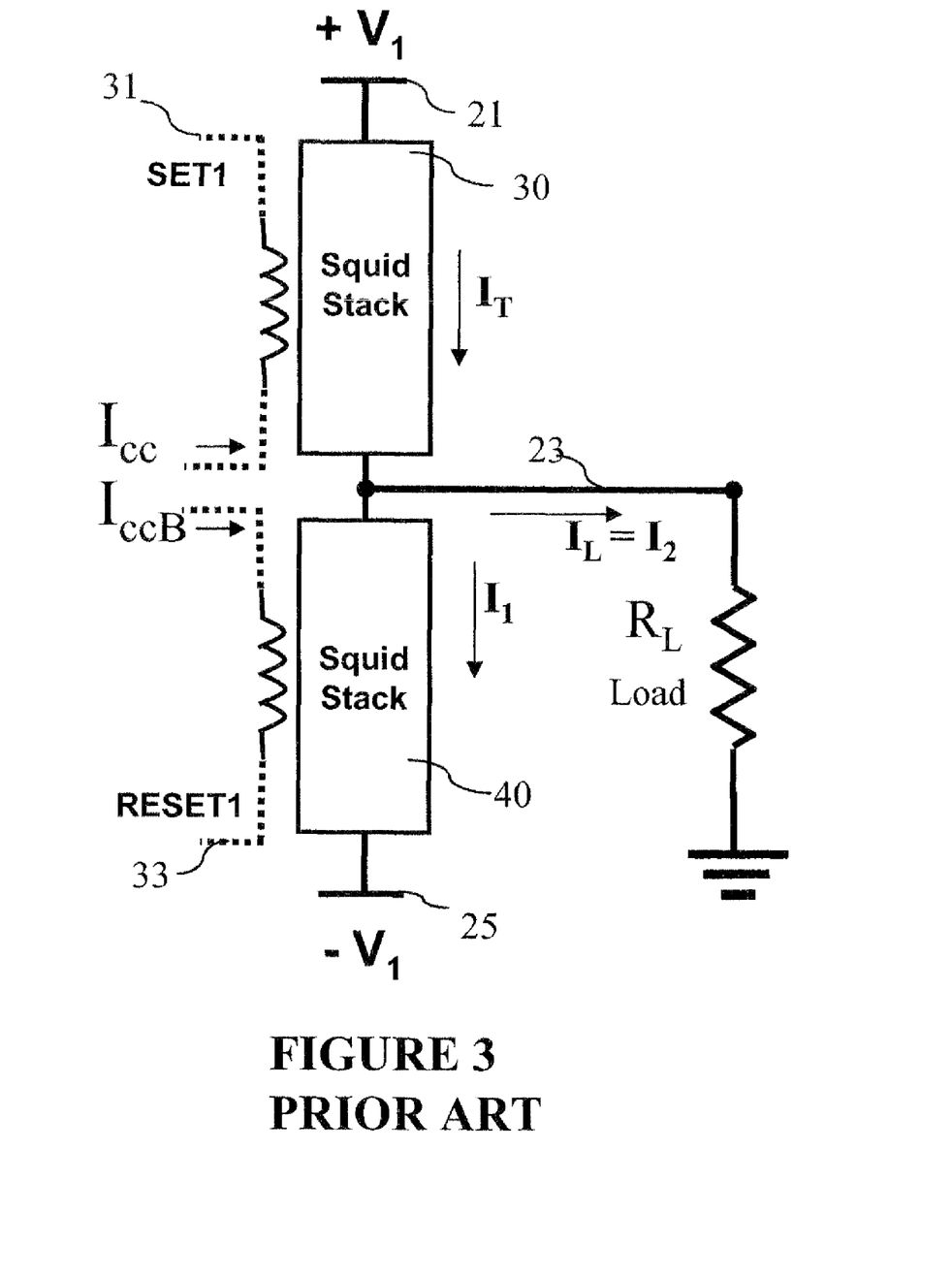
FIG. 3 is a block diagram of a SQUID stack amplifier as described in patent application Ser. No. 11/705,351.

FIG. 3 of this application is a block diagram of a superconductive switching amplifier based on SQUID stacks as described in FIG. 4 of that application. In response to a given input signal, complementary control signals are generated and coupled to the first and second set of SQUID stacks for raising the critical currents of the devices of one set while decreasing the critical current of the devices in the other set, whereby for one input signal condition the voltage on the first line is clamped via the low (zero) impedance of one set to the output terminal and for another input signal condition the voltage on the second voltage line is clamped via the low (zero) impedance of the other set to the output terminal. The output voltage is taken across the load resistor $R_L$. $R_L$ is connected to a common terminal having a value between the voltages applied to the respective SQUID stacks.

A number of techniques have been utilized in the prior art for interfacing RSFQ circuits to room temperature electronics. In an article in the IEEE Transactions on Applied Superconductivity, Volume 7, No. 2, June 1997, entitled "Josephson Output Interfaces for RSFQ Circuits", by O. Mukhanov, S. Rylov, D. Gaidarenko, N. Dubash and V. Borzenets, the authors discussed development of high bandwidth Josephson circuits to interface the output of RSFQ circuits to room temperature electronics. The article describes techniques for amplifying RSFQ signal levels to voltage outputs in the 2 to 4 mV range. The driver described in the article consists of a low-voltage, low output impedance, SFQ/DC converter, a Josephson transmission line (JTL) current amplifier and a stack of DC superconducting quantum interference devices (SQUIDs).

Digital SQUIDs are discussed in the IEEE Transaction on Applied Superconductivity, Volume 1, No. 1, March 1991, in an article entitled "RSFQ Logic/Memory Family: A New Josephson-Junction Technology for Sub-Terahertz-Clock-Frequency Digital Systems", by K. Likharev and V. Semenov.

U.S. Pat. No. 5,936,458 to Rylov, combines Josephson junction transmission lines and DC/SQUIDs into a superconducting amplifier.

3. Problems of the Prior Art

In order to transmit the digital information generated by and within these RSFQ circuits for processing by standard semiconductor circuits, several stages of amplification are needed to increase the amplitude of the pulses while maintaining high speed of operation without introducing noise and distortion.

In practice, when using a SQUID stack approach, there may be a large number (e.g. 50) of SQUIDs in each stack. The reason for stacking a large number of SQUIDs is that the resistance of a single SQUID when in the resistive state is in the range of one Ohm and the current through the SQUID is generally in the order of half (0.5) a milliampere. Thus, in order to produce signal voltages in the millivolt range it is necessary to have resistances in the range of 40 or 50 ohms. This can only be achieved by connecting a large number of SQUIDs in series.

Another problem is that the characteristics of the SQUIDs in the stack should be very similar, if not identical. This requires that the reproducibility of the devices be well controlled. The difficulty in making a large number of identical devices puts a limit on the number of SQUIDs that can be reliably fabricated for series connection. Another problem is that of controlling the responses of SQUIDs in a stack so that they are all driven to the superconductive state or to the resistive state at the same time. When a large number of SQUIDs are connected in series, this becomes very problematic since the control signals for setting or resetting the SQUIDs must be distributed over relatively large distances at the frequencies of interest. At the operating frequencies of interest, very small differences in the length of a wire can cause a significant difference in the time when one device response is compared to another (i.e., propagation delay of the control signals). Differences in the response time of the devices of a stack reduces the effective bandwidth of the circuit very significantly.

Further, the devices of the prior art have had a very limited bandwidth.

BRIEF SUMMARY OF THE INVENTION

The present invention is focused on achieving high-speed digital output based on modified transimpedance digital amplifiers and semiconductor amplifiers, in a way that was not previously feasible. Some aspects of the invention are:

1. Conventional RSFQ technology is unipolar, as is the non-inverting transimpedance digital amplifier. For RSFQ implementation, the amplifier is preceded by a pulse-density to pulse-width-modulator that converts the pulse-densitymodulated (PDM) data stream into a pulse-width-modulated (PWM) current. This pulse-width-modulated current acts as an input to the transimpedance amplifier that produces a positive voltage at the output. Thus it acts as a non-inverting transimpedance digital amplifier. As part of this invention, a new "inverting transimpedance digital amplifier" was developed and demonstrated. The inverting transimpedance digital amplifier is also preceded by a PDM-to-PWM and takes in positive polarity current as input, but produces a negative voltage at the output. Thus it acts as an inverting transimpedance digital amplifier.

2. The non-inverting and the inverting amplifiers are combined in the same circuit to create a new single input, differential output amplifier. The voltage swing on each of the two individual outputs is still unipolar with the swing on one output being from zero to positive voltage level while on other from zero to negative voltage level. However the combined output voltage between the two individual outputs will be twice the amplitude of individual outputs. In other words, the gain of the differential amplifier is twice the gain of an individual inverting or non-inverting amplifier (0.4 instead of 0.2 mV).

3. Modern fabrication technology, combined with standard device scaling (voltages increase as the square root of the critical current density Jc), yields a differential voltage swing of 0.8 mV for the Jc=4.5 kA/cm$^2$ process, and twice that for the newer 20 kA/cm$^2$ process.

4. Modern semiconductor amplifiers used with the present invention have improved gain-bandwidth products, so they can achieve the required gain at higher speeds.

5. Cooling these semiconductor amplifiers to cryogenic temperatures (as low at 4 K) increases the (low-noise) sensitivity of the amplifiers to input differential voltages less than 1 mV.

6. Convenient cryogenic packaging of both superconducting and semiconductor circuits.

7. The invention utilizes many fewer Josephson junctions which therefore require less power and less on chip real estate. Further, the fewer Josephson junctions results in a better fabrication yield and reduce the complexity of circuit design and implementation.

One aspect of the invention is directed to a construction of an inverting transimpedance digital amplifier.

Another aspect of the invention is directed to a differential transimpedance digital amplifier which utilize both non-inverting and inverting transimpedance digital amplifier.

Another aspect of the invention relates to the packaging of the differential transimpedance digital amplifier with a cooled semiconductor amplifier. The packaging can be on the same chip, on the same multi-chip module, or the cooled amplifier can be a separate RF package connected with a matched transmission line to the transimpedance digital amplifier.

BRIEF DESCRIPTION OF THE DRAWINGS

The invention will now be described with reference to the following drawings in which.

DETAILED DESCRIPTION OF THE INVENTION

Figure 1:
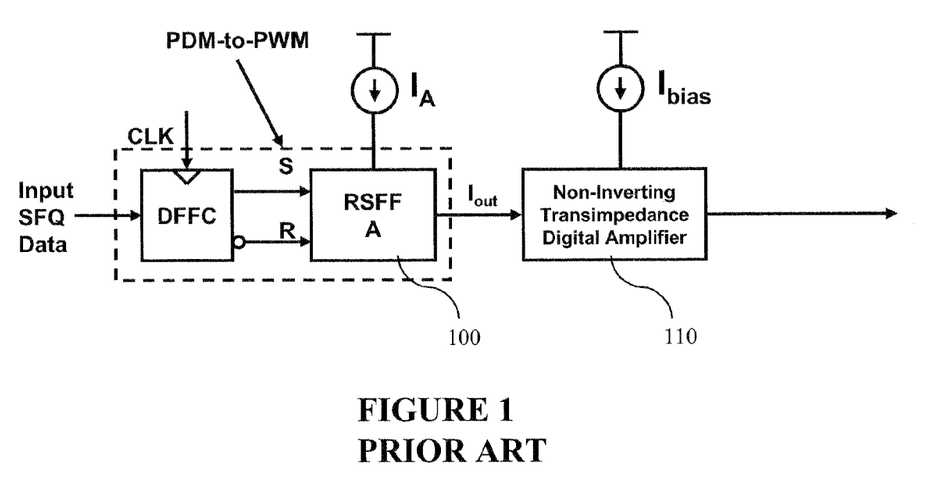
FIG. 1 is a block diagram of a non-inverting transimpedance digital amplifier preceded by a PDM-to-PWM converter of the prior art.

FIG. 1 is a block diagram of the non-inverting transimpedance digital amplifier which has been utilized in the prior art. Incoming data as received at the set (S) and reset (R) inputs of an RSFQ RS flip-flop 100 and the output pulse-width-modulated current are applied to the non-inverting transimpedance digital amplifier 110.

Figure 2:
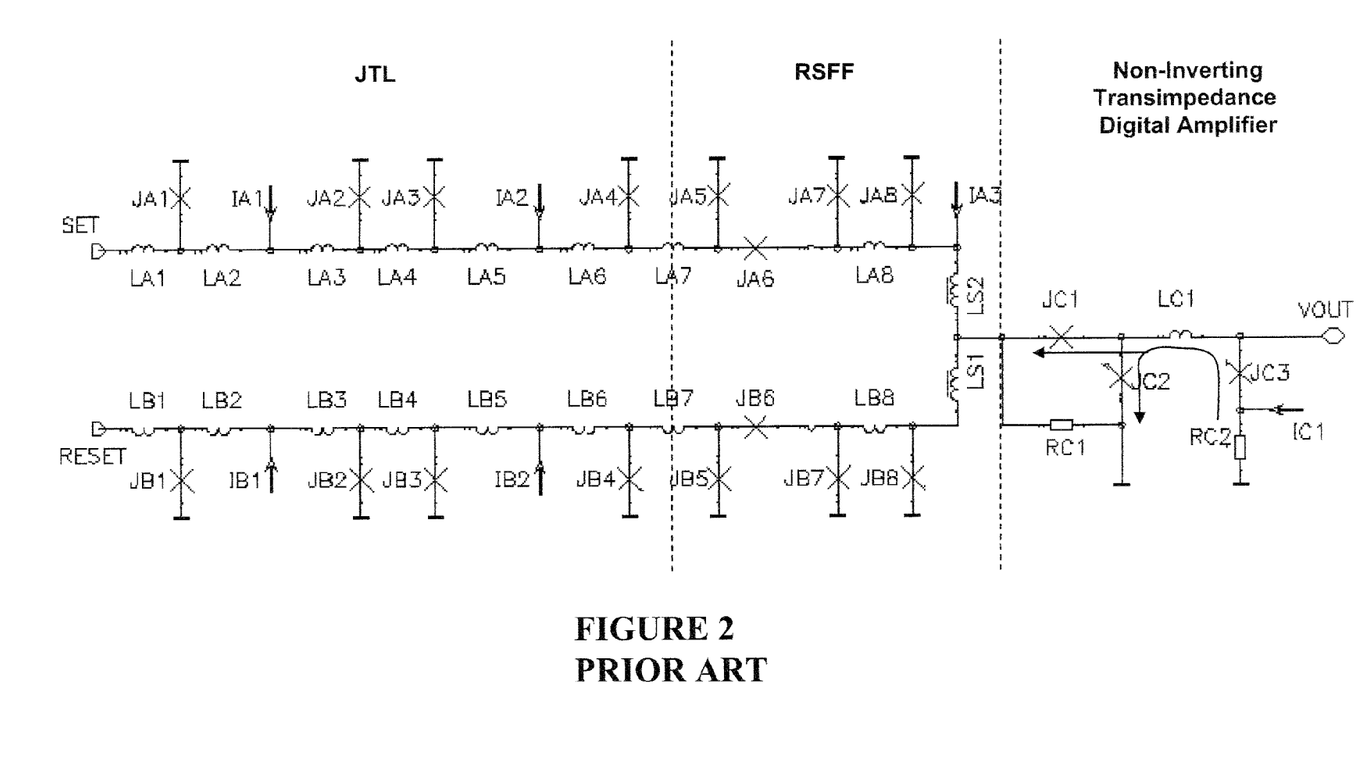
FIG. 2 is a schematic diagram of the prior art showing the interface between an RSFF and the non-inverting transimpedance digital amplifier as shown in FIG. 1.

FIG. 2 is a schematic diagram of the prior art showing the interface between an RSFF and a non-inverting transimpedance digital amplifier shown in FIG. 1. Josephson transmission lines (JTL) are routinely used as interconnects between logic devices in RSFQ technology. Josephson junctions JA5-JA8 and JB5-JB8, LS1 and LS2 constitute an RS flip-flop which converts the pulse density modulated data stream received over the JTL into pulse-width-modulated current that drives the non-inverting transimpedance digital amplifier.

The PDM-to-PWM converter shown in FIG. 1 takes in SFQ (single flux quantum) pulses as control inputs (SET and RESET) and produces a PWM current $I_{out}$ at the output. At the heart of the PDM-to-PWM is a RSFQ flip-flop such as an RS flip-flop 100 (shown) or toggle flip-flop (not shown). In response to a SET pulse at its input (FIG. 2), the RS flip-flop stores single flux quanta in the storage inductor (LS1, LS2) representing state "1". Absence of the flux quanta represents state "0" and is achieved by the reset pulse at the input. The RS flip-flop is preceded by a D flip-flop (shown in FIG. 1) with complementary outputs that generates the complementary SET and RESET pulses from the input data stream.

Josephson transmission lines (JTL) are routinely used as interconnects between logic gates in RSFQ technology. The response of the RS flip-flop of FIG. 2 to SET and RESET pulses is as follows: on receiving a SET pulse, and if the RS flip-flop is in state "0", there is a fluxon flow from JA1 to JA8.

The switching of JA8 stores a single flux quantum ($\phi_0$) in the storage inductors in form of current equal to $\phi_0/L$, where L is the inductance of the storage inductor. This current in turn acts like a bias to junction JB8. If the RS flip-flop is already in state "1", the arrival of SET pulse causes JA6 to switch, preventing the fluxons from propagating to JA7 and JA8, thus not disturbing the state of RS flip-flop. Similarly, on receiving a RESET pulse, and if the RS flip-flop is in state "1", there is a fluxon flow from JB1 to JB8. The switching of JB8 resets the stored flux quantum and drives the current in the storage inductors to zero. If the RS flip-flop is already in state "0", the arrival of RESET pulse causes JB6 to switch, preventing the fluxons from propagating to JB7 and JB8, thus not disturbing the state of RS flip-flop. Thus the circuit converts the pulse-density-modulated (PDM) data stream into a pulse-width-modulated (PWM) current.

The transimpedance digital amplifier consists of junctions JC1, JC2 and JC3. Junctions JC1 and JC2 behave like a voltage switch which is directly coupled to the storage inductor and monitors the state of the flip-flop. When there is no stored flux quanta in the flip-flop (state "0"), the switch is in superconducting state and produces a zero voltage drop. What this means is that most of the current IC1 goes to the ground via the superconducting path through junction JC2. However since the device isolation in this technology is poor and the current distributes in inverse proportion to the inductance, there is a small part of IC1 that goes through JC1, and further divides between the paths LS1, JB8 to ground and LS2, JA8 to ground. Similarly, most of the current from IA3 passes through JA8 to ground while a small part goes through LS2, LS1, and JB8 to ground. On the other hand, when there is a flux quantum inside the flip-flop (state "1"), a part of the resulting current in the storage inductor flows through JC2, causing the total current through JC2 to exceed its critical current. This causes JC2 to go resistive and changes the current distribution in the circuit. Since JC2 goes resistive, a larger fraction of IC1 is diverted towards JC1, which causes the total current through JC1 to exceed its critical current and driving JC1 into a resistive state as well. Since both JC1 and JC2 are resistive, the current IC1 redistributes with a fraction now flowing through the load resistor. Consequently an output voltage is obtained across the load.

Figure 5:
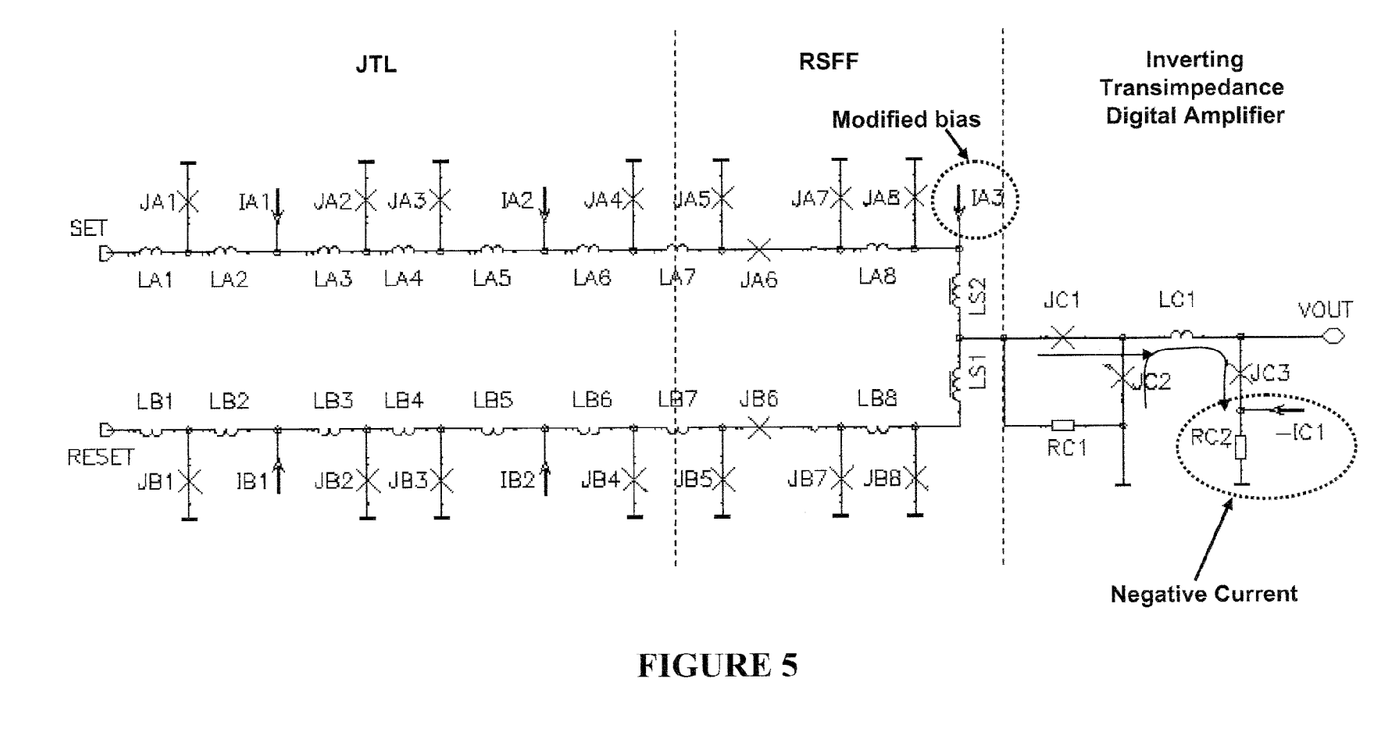
FIG. 5 is a schematic diagram of an inverting transimpedance digital amplifier shown in FIG. 4 in accordance with one aspect of the invention.

However it is not intuitively clear as to how the non-inverting transimpedance digital amplifier can be modified to generate negative voltages across the load. This is at least because isolation among components shown in the schematics of FIGS. 2 and 5 is very poor. It would seem that the application of IC1 with a negative polarity (–IC1) would reverse the direction of current through JC2. More specifically, when the RS flip-flop is in state "0", most part of –IC1 flows through the loop formed by ground to JC2 to the source –IC1. Since the direction of flow current through JC2 is reversed, the RS flip-flop in state "1" will cause a current to flow through JC2 in a direction opposite to the direction of –IC1, thereby preventing JC2 from going resistive. In absence of the voltage switch going resistive, no voltage can be produced across the load. Moreover application of negative IC1, and a direct coupling between the RS flip-flop and the transimpedance amplifier means that only a part of IA3 now flows through JA8 to ground and a considerable part flows through JC1 towards the current source –IC1. This meant that on receiving a SET pulse in state "0", junction JA8 is not sufficiently biased to switch and store a fluxon in the storage inductor. A part of the invention lies in optimizing the current bias IA3. More specifically in one possible implementation, IA3 is scaled up (about 1.5 times the value for RSFF A), the current bias to JA8 increases and also the part of IA3 flowing through JC1 to –IC1 increases. This additional bias helps JA8 switch on receiving the SET pulse, thereby storing a flux quantum in the storage inductor. A part of the current in storage inductor in state "1" flows through JC1 towards –IC1. This causes the current through JC1 to exceed its critical current, and thereby go resistive. This causes additional current through JC2 towards –IC1 causing JC2 to switch and thereby go resistive. In response to the voltage switch going resistive, current –IC1 redistributes with a part of current flowing through load and thereby generating a negative voltage drop across the load.

This development of the inverting transimpedance digital amplifier paves way for the development of the differential transimpedance digital amplifier that produces complementary positive and negative voltage waveforms to double the gain of the amplifier.

As noted above, FIG. 3 is a block diagram of a SQUID stack amplifier as described in patent application Ser. No. 11/705,351. A single-ended output version of the amplifier is shown here; a differential-output version with twice the number of SQUID stacks is also disclosed in the same patent application.

Figure 4:
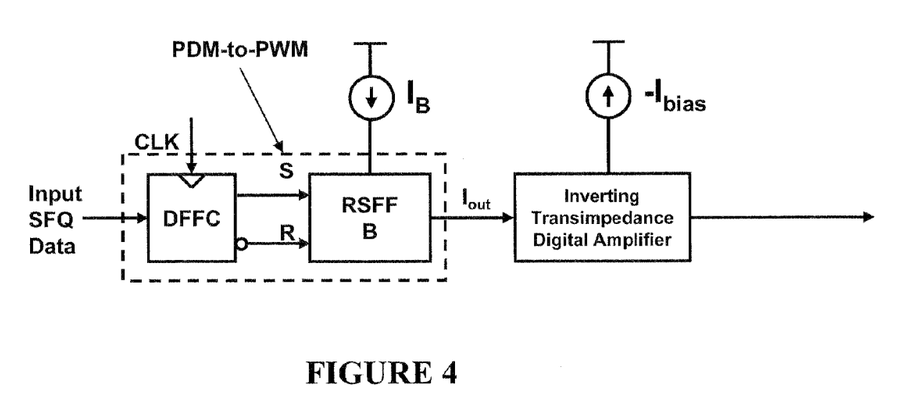
FIG. 4 is a block diagram of an inverting transimpedance digital amplifier in accordance with one aspect of the invention.

FIG. 4 is a block diagram of an inverting transimpedance digital amplifier in accordance with one aspect of the invention. Although non-inverting transimpedance digital amplifiers have been used in the prior art, inverting transimpedance digital amplifiers have not been known or used. Applicants have developed an inverting transimpedance digital amplifier which, when combined with the non-inverting transimpedance digital amplifiers of the prior art, provides considerable benefits.

FIG. 5 is a schematic diagram showing the interface between RSFF and the inverting transimpedance digital amplifier in accordance with one aspect of the invention. As shown in FIG. 5, the portion of the figure to the left of the dashed vertical line running through inductors LA7 and LB7 constitutes a Josephson transmission line. The junctions to the right of that line and extending to the second vertical dashed line constitute an RS flip-flop. The balance of the diagram, to the right of the second vertical dashed line describes an inverting transimpedance digital amplifier in accordance with one aspect of the invention.

The inductors LS1 and LS2 form a storage element which contains a value 1 when a flux quantum is stored and a value is zero if there is no flux quantum. The negative current –IC1 applied to the junction of JC3 and RC2, requires that the positive bias shown at IA3 must be modified to insure that junction JA8 will switch properly. With JC1 and JC2 in superconductive state, that is, with substantially zero resistance in each junction, the voltage out will be substantially zero. With JC1 and JC2 in resistive state, that is in a maximum impedance state, the voltage on $V_{out}$ will be set by the current –IC1 times RC2, which serve as a negative voltage source through junction JC3 to the $V_{out}$ terminal.

Figure 6A:
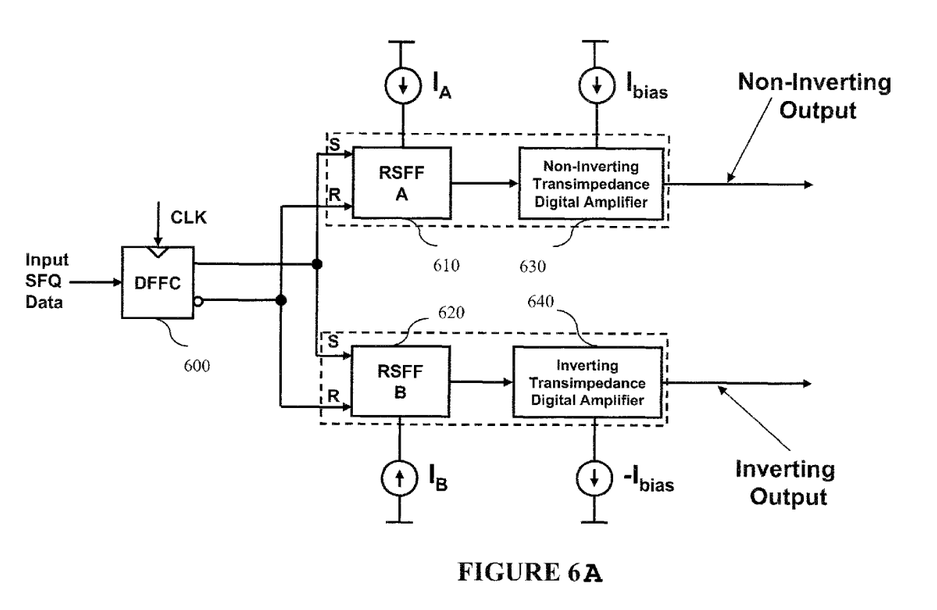
FIG. 6A shows a block diagram of a superconducting differential transimpedance digital amplifier in accordance with one aspect of the invention.

FIG. 6A illustrates a preferred component layout of a differential transimpedance digital amplifier in accordance with one aspect of the invention.

Figure 6B:
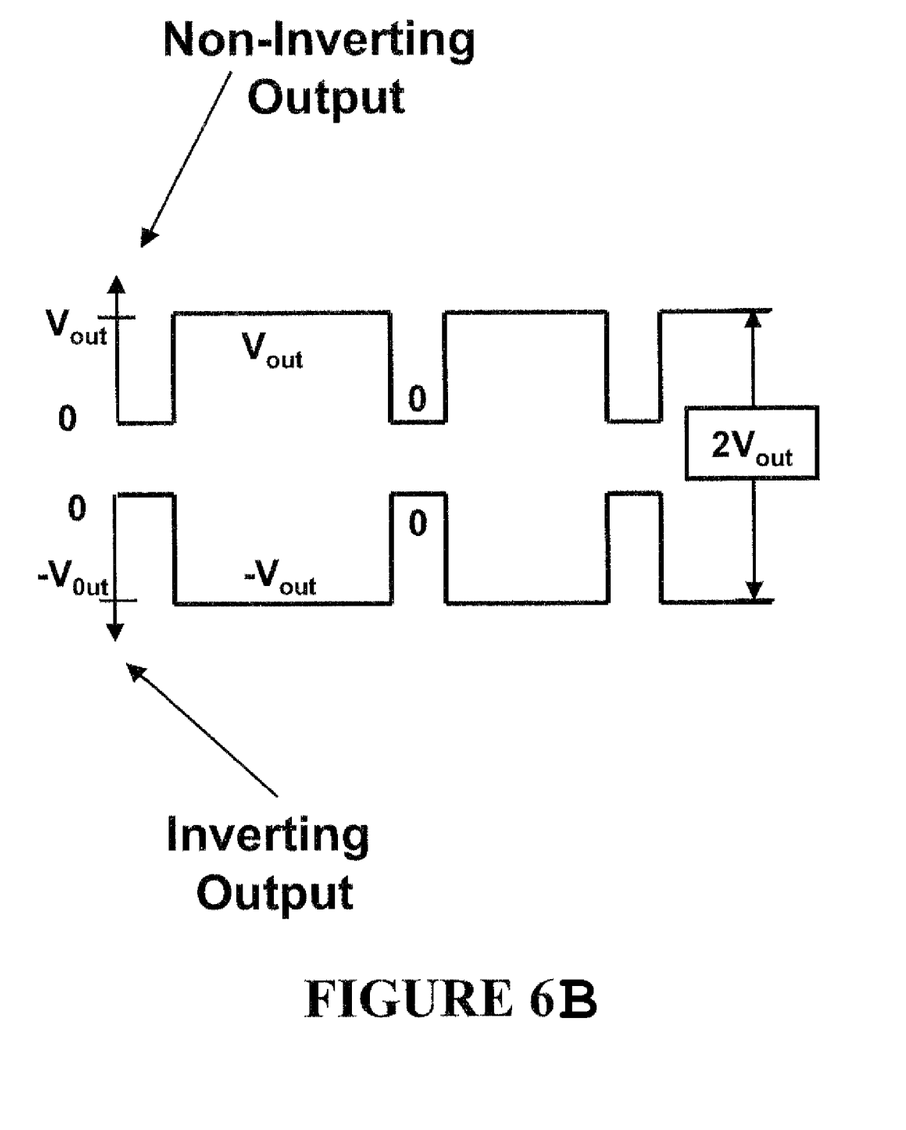
FIG. 6B is a voltage graph of the voltage between the inverting and non-inverting outputs of the superconducting differential transimpedance digital amplifier.

As shown in FIG. 6A, incoming SFQ data is applied to a D flip-flop (DFFC) 600 having complementary outputs. The regular output of DFFC 600 is applied to the set input of each RS flip-flop (RSFF) 610 and 620. The inverted output from DFFC 600 is applied to both reset inputs of RS flip-flop 610 and RS flip-flop 620. The output of the RS flip-flop 610 is applied to the input of the non-inverting transimpedance digital amplifier of a type shown, for example, in FIG. 1. The output of RS flip-flop 620 is applied to the input of inverting transimpedance digital amplifier 640 producing the output voltage graphs shown in FIG. 6A of the voltages on the respective output lines of the differential transimpedance digital amplifier. As shown in FIG. 6B, the peak voltage output which results across the two output lines of the differential inverting transimpedance digital amplifier is equal to the sum of the absolute value of the output voltages of each output line. In the case shown, where $+V_{out}$ and $-V_{out}$ voltages are output from the respective non-inverting and inverting transimpedance digital amplifiers, the total voltage output is equal to the value $2V_{out}$.

Figure 7:
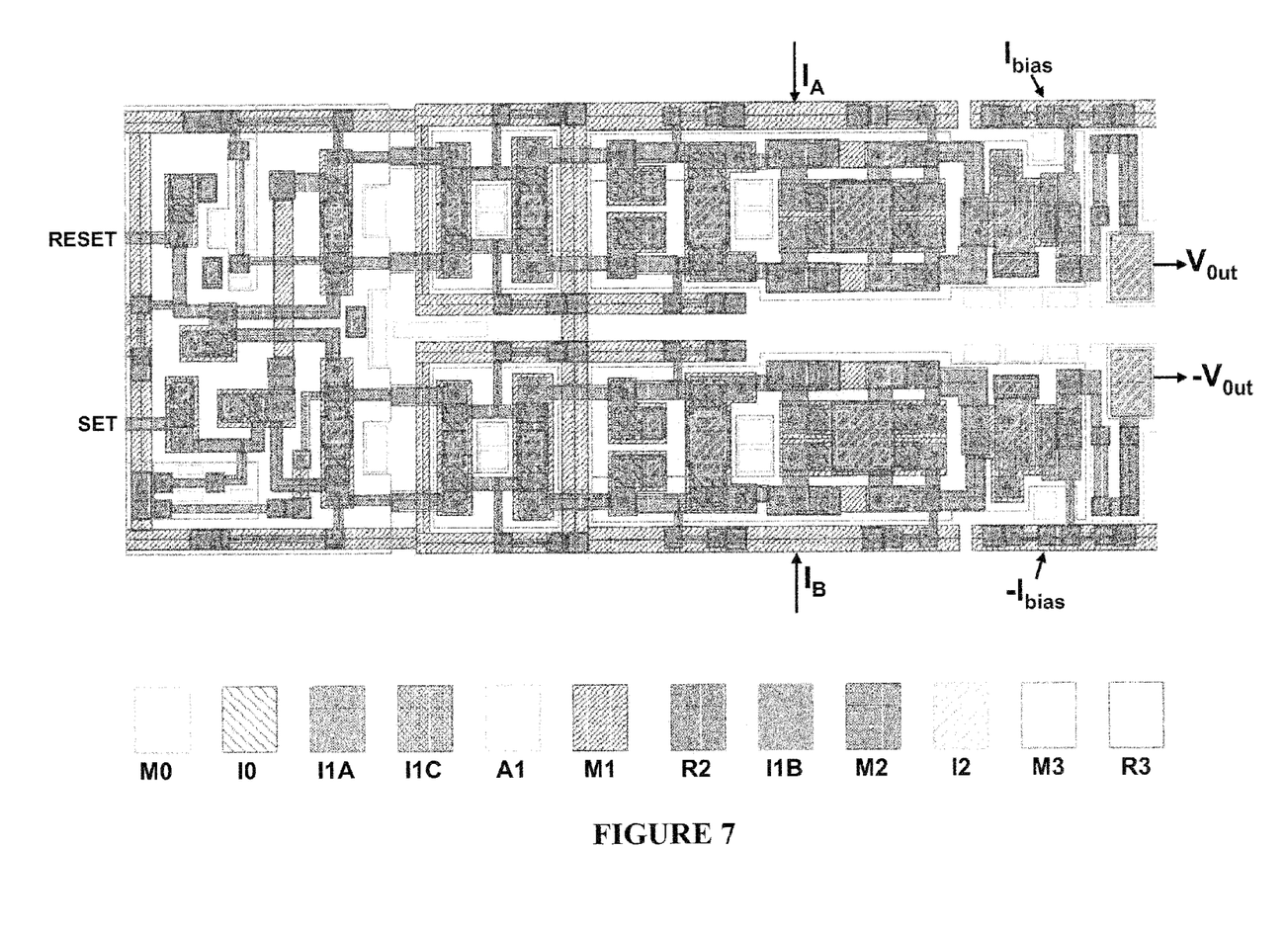
FIG. 7 illustrates a preferred layout of a differential transimpedance digital amplifier in accordance with one aspect of the invention with accompanying color key.

FIG. 7 illustrates a preferred layout of a differential transimpedance digital amplifier in accordance with one aspect of the invention, with its accompanying color key which links portions of the layout with design rules set forth in Appendix A.

Figure 8A:
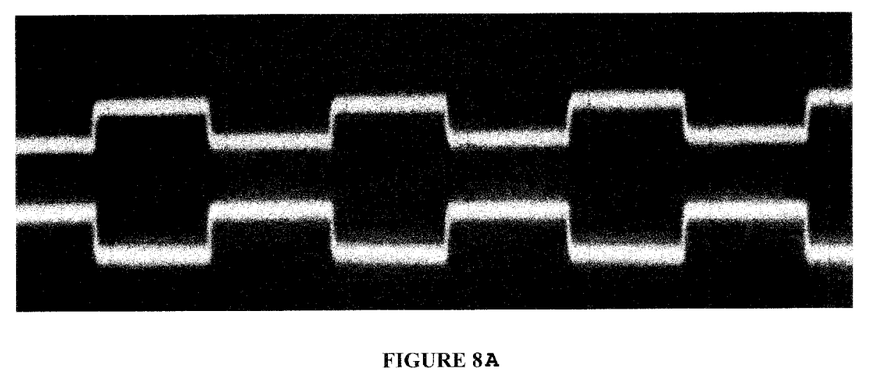
FIGS. 8A and 8B are screen captures waveforms resulting from low speed tests of a differential transimpedance digital amplifier in accordance with one aspect of the invention.
Figure 8B:
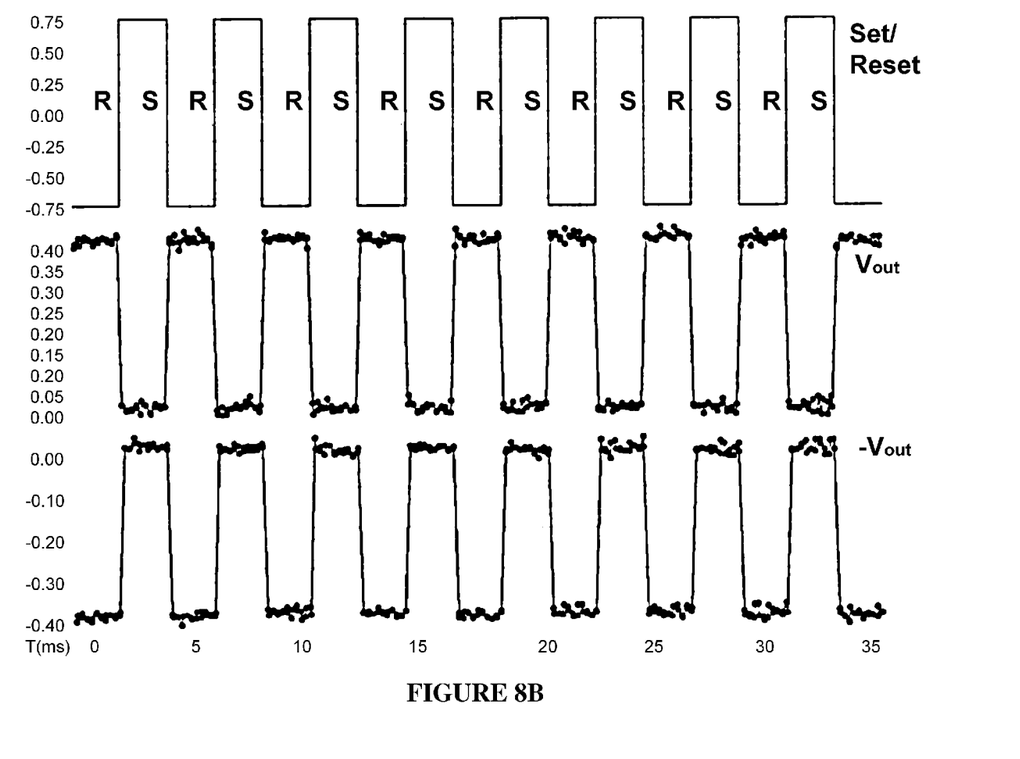

FIGS. 8A and 8B are screen captures of waveform resulting from low speed tests of a differential transimpedance digital amplifier in accordance with one aspect of the invention. Based on both theoretical and experimental determinations, both output voltage and switching speeds are expected to increase as the square root of the process critical current density Jc. Hence, the differential voltage of the transimpedance digital amplifier is expected to scale up to about 800 µV for the 4.5 kA/cm² and 1.6 mV for the 20 kA/cm² processes respectively. Some other superconducting amplifiers based on SQUID stacks are capable of delivering a larger output voltage but either have a limited output bandwidth or are generally much large in size and draw too much bias current in comparison to the differential transimpedance digital amplifier driver disclosed herein. The key advantage of the differential transimpedance digital amplifier driver disclosed herein is that its output bandwidth can be as large as a few tens of GHz and hence can be used to build high speed data links. Also the driver occupies relatively small area and draws much smaller bias current compared to the SQUID amplifier stacks.

Figure 9A:
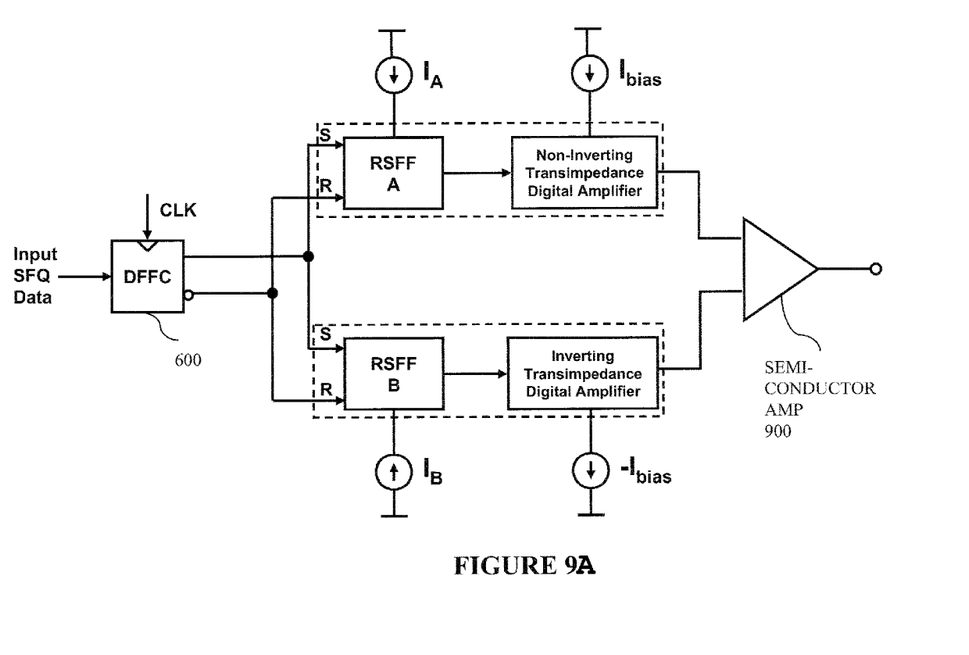
FIG. 9A is a block diagram of a differential transimpedance digital amplifier converter connected to a semiconductor amplifier.

FIG. 9A is a block diagram of a differential transimpedance digital amplifier of a type shown in FIG. 6A connected to a semiconductor amplifier, 900.

Figure 9B:
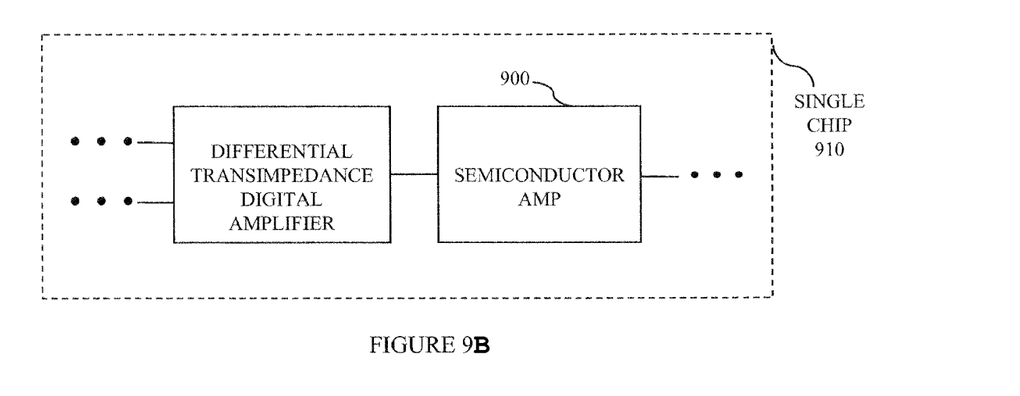
FIG. 9B is a diagram illustrating the packaging of a differential transimpedance digital amplifier with a semiconductor amplifier on a single chip.

FIG. 9B is a diagram illustrating the packaging of a differential transimpedance digital amplifier with a semiconductor amplifier 900 on a single chip 910. As shown in FIG. 9A, the differential transimpedance digital amplifier 900 is combined with semiconductor amplifier 800 on a single chip by mounting the semiconductor amplifier on same chip, 910.

Figure 9C:
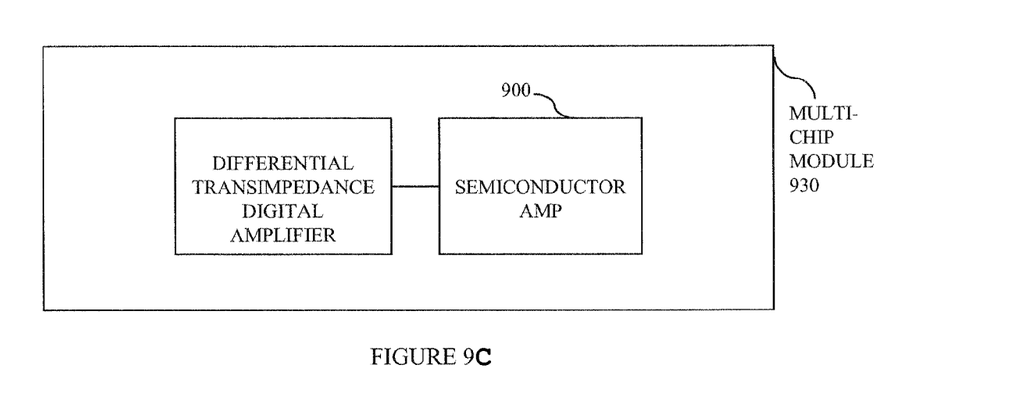
FIG. 9C is a diagram illustrating the packaging of a differential transimpedance digital amplifier with a semiconductor amplifier by mounting both the converter and the amplifier to a multi-chip module.

FIG. 9C is a diagram illustrating the packaging of a differential transimpedance digital amplifier with a semiconductor amplifier 900 by mounting both on a multi-chip module 930. In this case, the modules are fabricated separately on separate substrates and the chips are bonded or otherwise mounted to a multi-chip module and the connections there between are established using techniques well known in the art.

Figure 9D:
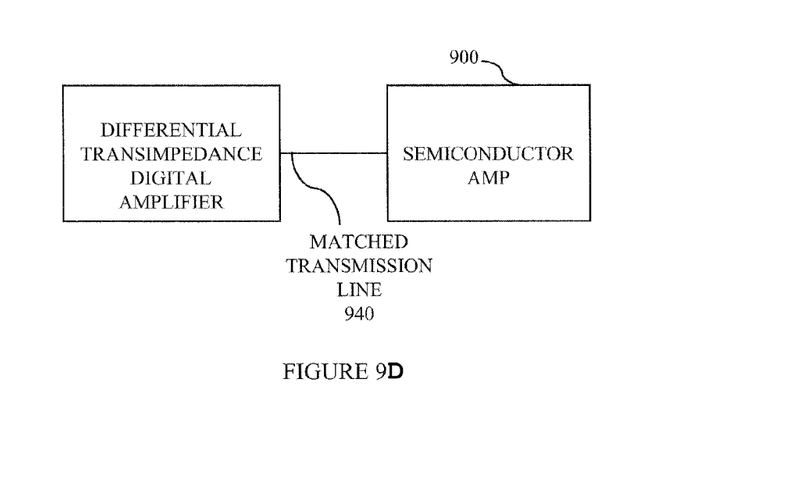
FIG. 9D illustrates a connection between a separate transimpedance digital amplifier and a semiconductor amplifier using a matched transmission line.

FIG. 9D illustrates a connection between a separate transimpedance digital amplifier and a semiconductor amplifier using a transmission line 940. Preferably, the transmission line is a matched transmission line. In this case, both modules are separately fabricated and mounted as desired with the output of the differential transimpedance digital amplifier being connected to the semiconductor amplifier using a matched transmission line 940.

While various embodiments of the present invention have been illustrated herein in detail, it should be apparent that modifications and adaptations to those embodiments may occur to those skilled in the art without departing from the scope of the present invention as set forth in the following claims.

What is claimed is:

1. A digital amplifier comprising an inverting transimpedance amplifier receiving a single quantum flux logic signal as an input and having an inverting output having a peak output voltage of at least $-400$ µV and an output bandwidth of at least 10 GHz.

2. The digital amplifier according to claim 1, further comprising a non-inverting transimpedance amplifier receiving the single quantum flux logic signal as an input and having a non-inverting output having a peak output voltage of at least $+400$ µV and an output bandwidth of at least 10 GHz, configured to differentially amplify the single quantum flux logic signal with a peak output range of at least $-400$ µV to $+400$ µV.

3. The digital amplifier according to claim 2, wherein the peak output voltage range is at least $-800$ µV to $+800$ µV.

4. The digital amplifier according to claim 1, wherein the peak output voltage is at least $-800$ µV.

5. The digital amplifier according to claim 1, wherein the inverting output comprises an amplified voltage state output signal.

6. The digital amplifier according to claim 1, wherein the inverting output comprises an amplified current state output signal.

7. The digital amplifier according to claim 1 whereby the inverting transimpedance amplifier comprises at least one Josephson junction.

8. The digital amplifier according to claim 7 whereby the Josephson junction technology comprises a process with critical current density of greater than 4 kA/cm².

9. The digital amplifier according to claim 1, further comprising logic adapted to convert a pulse density modulated signal to a pulse width modulated signal, and present the pulse width modulated signal as the single quantum flux logic signal.

10. The digital amplifier according to claim 1, further comprising a semiconductor amplifier configured to receive the inverting output.

11. The digital amplifier according to claim 2, further comprising a semiconductor amplifier configured to receive the inverting output and the non-inverting output, and produce a semiconductor amplifier output dependent on the difference between the inverting output and the non-inverting output.

12. The digital amplifier according to claim 11, wherein the semiconductor amplifier is cooled to cryogenic temperatures.

13. A method of amplifying a digital signal, comprising:
receiving a single quantum flux pulse density modulated signal;
converting the single quantum flux pulse density modulated signal to a pulse width modulated signal;
amplifying the pulse width modulated signal with at least an inverting digital transimpedance amplifier, to produce an inverting output comprising a peak output of at least $-400$ µV and an output bandwidth of at least 10 GHz; and
further amplifying the inverting output with a semiconductor amplifier.

14. The method according to claim 13, further comprising amplifying a pulse width modulated signal corresponding to the single quantum flux pulse density modulated signal with a non-inverting digital transimpedance amplifier to produce a non-inverting output comprising a peak output voltage of at least $+400$ µV and an output bandwidth of at least 10 GHz, wherein the semiconductor amplifier is configured to differentially amplify the inverting output and the non-inverting output.

15. The method according to claim 14, wherein the inverting output and the non-inverting output have a peak difference of at least 800 µV.

16. The method according to claim 13, wherein the inverting output and the non-inverting output have a peak difference of at least 1.6 mV.

17. The method according to claim 13, wherein the peak output is at least −800 μV.

18. The method according to claim 13, whereby the inverting digital transimpedance amplifier comprises at least one Josephson junction, having a critical current density of greater than 4 kA/cm$^2$.

19. The method according to claim 14, wherein the semiconductor amplifier is cooled to cryogenic temperatures.

20. An inverting transimpedance digital amplifier, comprising a Josephson junction circuit, receiving a unipolar input pulse, and having an element having an impedance coupled to bias voltage potential which is negative with respect to a polarity of the input pulse, selectively producing a negative voltage output or a substantially zero voltage output depending on a state of an SFQ storage element.

21. The inverting transimpedance digital amplifier according to claim 20, further comprising:
- a non-inverting transimpedance digital amplifier, comprising a Josephson junction circuit, receiving a unipolar input pulse, and selectively producing a positive voltage output or a substantially zero voltage output depending on a state of an SFQ storage element; and
- a semiconductor differential amplifier, receiving signals from the inverting digital transimpedance amplifier and the non-inverting digital transimpedance amplifier, and producing an output signal representing a difference therebetween, having an output bandwidth of at least 10 GHz.

* * * * *